United States Patent
Frolikov

(10) Patent No.: US 10,761,773 B2
(45) Date of Patent: Sep. 1, 2020

(54) RESOURCE ALLOCATION IN MEMORY SYSTEMS BASED ON OPERATION MODES

(71) Applicant: Micron Technology, Inc., Boise, ID (US)

(72) Inventor: Alex Frolikov, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 15/942,997

(22) Filed: Apr. 2, 2018

(65) Prior Publication Data

US 2019/0303040 A1 Oct. 3, 2019

(51) Int. Cl.
G11C 29/00 (2006.01)
G06F 3/06 (2006.01)
G11C 29/08 (2006.01)

(52) U.S. Cl.
CPC .......... G06F 3/0659 (2013.01); G06F 3/0604 (2013.01); G06F 3/0679 (2013.01); G11C 29/08 (2013.01)

(58) Field of Classification Search
CPC .... G06F 3/0659; G06F 3/0604; G06F 3/0679; G06F 3/0634; G06F 3/0606; G11C 29/08
USPC ....... 714/718, 724, 725, 741, 742, 6.1, 6.11, 714/6.21, 10, 25, 28, 29, 31, 32, 33
See application file for complete search history.

(56) References Cited

U.S. PATENT DOCUMENTS

| | | | | |
|---|---|---|---|---|
| 7,577,766 | B2 * | 8/2009 | Ono ................... | H04N 1/00278 710/14 |
| 2012/0284453 | A1 * | 11/2012 | Hashimoto ........... | G06F 3/0634 711/103 |
| 2013/0124932 | A1 * | 5/2013 | Schuh .................... | G11C 29/08 714/718 |
| 2014/0163716 | A1 * | 6/2014 | Chang ...................... | G06F 1/26 700/117 |

OTHER PUBLICATIONS

"Solid-State Drive", Wikipedia, printed on Mar. 14, 2018.
Cameron Wilmot, "Kingston Factory Tour—Making of an SSD from Start to Finish", Apr. 6, 2012.

* cited by examiner

Primary Examiner — Christine T. Tu
(74) Attorney, Agent, or Firm — Greenberg Traurig

(57) ABSTRACT

A memory system having a mode indicator, a set of hardware resources, a set of media, and a controller. When the mode indicator identifies a factory mode, a first portion of the hardware resources is reserved for performance of factory functions by the controller and a second portion of the hardware resources is allocated for performance of normal functions. When the mode indicator identifies a user mode, both the first portion and the second portion are allocated for the performance of the normal function. The normal functions are performed by the controller to at least store data in and retrieve data from the set of media in response to requests from a host system.

20 Claims, 4 Drawing Sheets

RESOURCE ALLOCATION IN MEMORY SYSTEMS BASED ON OPERATION MODES

FIELD OF THE TECHNOLOGY

At least some embodiments disclosed herein relate to memory systems in general, and more particularly, but not limited to hardware resource allocation based on operation modes.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A stack in a computing device has a memory that allows data to be added into the memory for storage and then retrieved from the memory for consumption in a last in first output manner.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
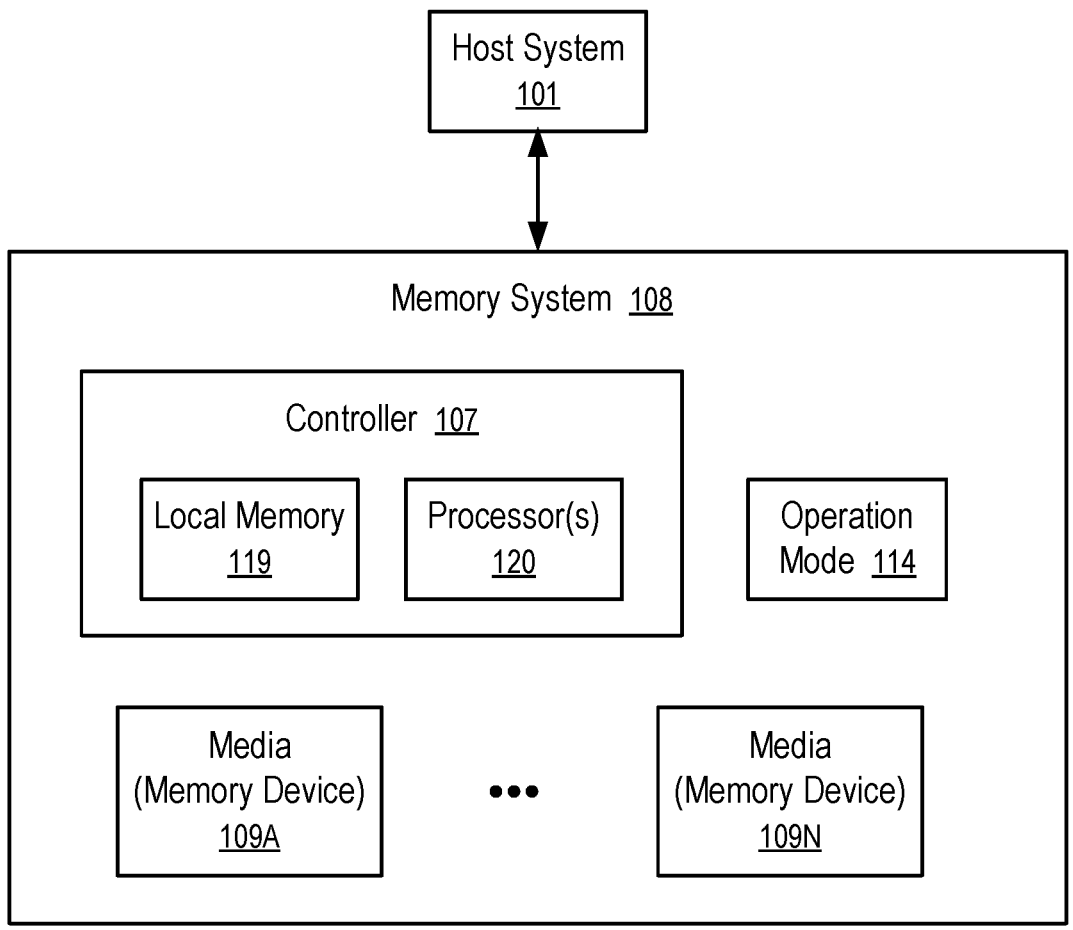
FIG. 1 shows a computing system having a memory system configured to allocate hardware resources based on operation modes in accordance with some embodiments of the present disclosure.

At least some aspects of the present disclosure are directed to allocation of hardware resources in memory system, such as stack memory, based on operation modes of the memory systems. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, memory units formed based on negative-and (NAND) logic gates, memory units formed based on negative-or (NOR) logic gates, etc. The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system is used as one example of the memory system in the present disclosure.

A memory system can be assembled and tested in a manufacturing facility and then installed in a computer system to perform its designed, normal service functions in the computer system. During the manufacturing process, the memory system can be temporarily connected in a computing system at the manufacturing facility for diagnosis, testing, and/or other processing and preparation. An indicator is stored in the memory system to indicate whether the memory system is in the manufacturing phase or in a production phase.

During the time of the diagnosis and/or testing, the indicator has a value indicating that the memory system is in the manufacturing phase. When operated in a computing system with such a value of the indicator in the memory system, the memory system is in the manufacturing/factory mode and is configured to perform not only the designed, normal service functions, but also additional functions that are specific to the manufacturing of the memory system, such as diagnosis and testing. Some of hardware resources in the memory system, such as stack memory and/or processors, are reserved and allocated for the additional functions. To complete the manufacturing of the memory system, the indicator is changed to another value indicating that the memory system is in the production phase.

When the indicator has the value representing the production phase, the memory system operates in a production/user mode in which the memory system performs the designed, normal service functions in a computer system in which the memory system is installed and does not performed the additional functions specific for the manufacturing process. The hardware resources allocated for the additional functions in the manufacturing mode are released and made available for the normal functions. Such an arrangement can improve the performance of the memory system in performing the normal functions in the production/user mode.

FIG. 1 shows a computing system having a memory system (108) configured to allocate hardware resources based on operation modes in accordance with some embodiments of the present disclosure.

For example, the operation mode (114) stored in the memory system (108) indicates whether the memory system (108) is in a manufacturing phase or in a production phase. When the memory system (108) is in a manufacturing phase, some of the resources (e.g., a portion of a local memory (119) and the processor(s) (120)) are reserved for functions specific for a manufacturing mode. When the memory system (108) is in the production phase but not in the manufacturing phase, the reserved resources are released and made available for use by other functions.

In general, the memory system (108) can include media, such as memory devices (109A to 109N). The memory devices (109A to 109N) can be volatile memory devices, non-volatile memory (NVM) devices, or a combination of such. In some embodiments, the memory system (108) is a storage system. An example of a storage system is a solid state drive (SSD). In some embodiments, the memory system (108) is a hybrid memory/storage system. In general, the computing system can include a host system (101) that uses the memory system (108). In some implementations, the host system (101) can write data to the memory system (108) and read data from the memory system (108).

The host system (101) can be a computing device such as a desktop computer, laptop computer, network server, mobile device, or such computing device that includes a memory and a processing device. The host system (101) can include or be coupled to the memory system (108) so that the host system (101) can read data from or write data to the memory system (108). The host system (101) can be coupled to the memory system (108) via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Small Computer System Interface (SCSI), Serial Attached SCSI (SAS), etc. The physical host interface can be used to transmit data between the host system (101) and the memory system (108). The host system (101) can further utilize an NVM Express (NVMe) interface to access the memory devices (109A to 109N) when the memory system (108) is coupled with the host system (101) by the PCIe interface. The physical host interface can provide an interface for passing control, address, data, and other signals between the memory system (108) and the host system (101).

The memory devices (109A to 109N) can include any combination of the different types of non-volatile memory devices and/or volatile memory devices. An example of non-volatile memory devices includes a negative-and (NAND) type flash memory. Each of the memory devices (109A to 109N) can include one or more arrays of memory cells such as single level cells (SLCs), multi-level cells (MLCs), triple level cells (TLCs), quad-level cells (QLCs), etc. In some implementations, a particular memory device can include both an SLC portion and a MLC (or TLC or QLC) portion of memory cells. Each of the memory cells can store one or more bits of data used by the host system (101). Although non-volatile memory devices such as NAND type flash memory are described, the memory devices (109A to 109N) can be based on any other type of memory such as a volatile memory. In some implementations, the memory devices (109A to 109N) can be, but are not limited to, random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices (109A to 109N) can be grouped as memory pages or data blocks that can refer to a unit of the memory device used to store data.

The controller (107) can communicate with the memory devices (109A to 109N) to perform operations such as reading data, writing data, or erasing data at the memory devices (109A to 109N) and other such operations. The controller (107) can include hardware such as one or more integrated circuits and/or discrete components, a buffer memory, or a combination thereof. The controller (107) can be a microcontroller, special purpose logic circuitry (e.g., a field programmable gate array (FPGA), an application specific integrated circuit (ASIC), etc.), or another suitable processor. The controller (107) can include one or more processors (processing devices) (120) configured to execute instructions stored in local memory (119).

In the illustrated example, the local memory (119) of the controller (107) includes an embedded memory configured to store instructions for performing various processes, operations, logic flows, and routines that control operation of the memory system (108), including handling communications between the memory system (108) and the host system (101), and the functions related to the operation mode (114), which is described in greater detail below. In some embodiments, the local memory (119) can include memory for implementation of stacks managed according to the operation mode (114) and/or memory registers storing, e.g., memory pointers, fetched data, etc. The local memory (119) can include read-only memory (ROM) for storing micro-code.

While the example memory system (108) in FIG. 1 has been illustrated as including the controller (107), in another embodiment of the present disclosure, a memory system (108) may not include a controller (107), and may instead rely upon external control (e.g., provided by an external host, or by a processor or controller separate from the memory system).

In general, the controller (107) can receive commands or operations from the host system (101) and can convert the commands or operations into instructions or appropriate commands to achieve the desired access to the memory devices (109A to 109N). The controller (107) can be responsible for other operations such as wear leveling operations, garbage collection operations, error detection and error-correcting code (ECC) operations, encryption operations, caching operations, and address translations between a logical block address and a physical block address that are associated with the memory devices (109A to 109N). The controller (107) can further include host interface circuitry to communicate with the host system (101) via the physical host interface. The host interface circuitry can convert the commands received from the host system into command instructions to access the memory devices (109A to 109N) as well as convert responses associated with the memory devices (109A to 109N) into information for the host system (101).

The memory system (108) can also include additional circuitry or components that are not illustrated. In some implementations, the memory system (108) can include a cache or buffer (e.g., DRAM) and address circuitry (e.g., a row decoder and a column decoder) that can receive an address from the controller (107) and decode the address to access the memory devices (109A to 109N).

In one example, the host system (101) has one or more connectors to provide the memory system (108) with power and/or communicate with the memory system (108) via a communication channel and a predetermined protocol; and the memory system (108) has one or more connectors to receive the power, data and commands from the host system (101). For example, the connection between connector on the host system (101) and connector on memory system (108) may utilize a PCIe bus or a SATA bus.

Figure 2:
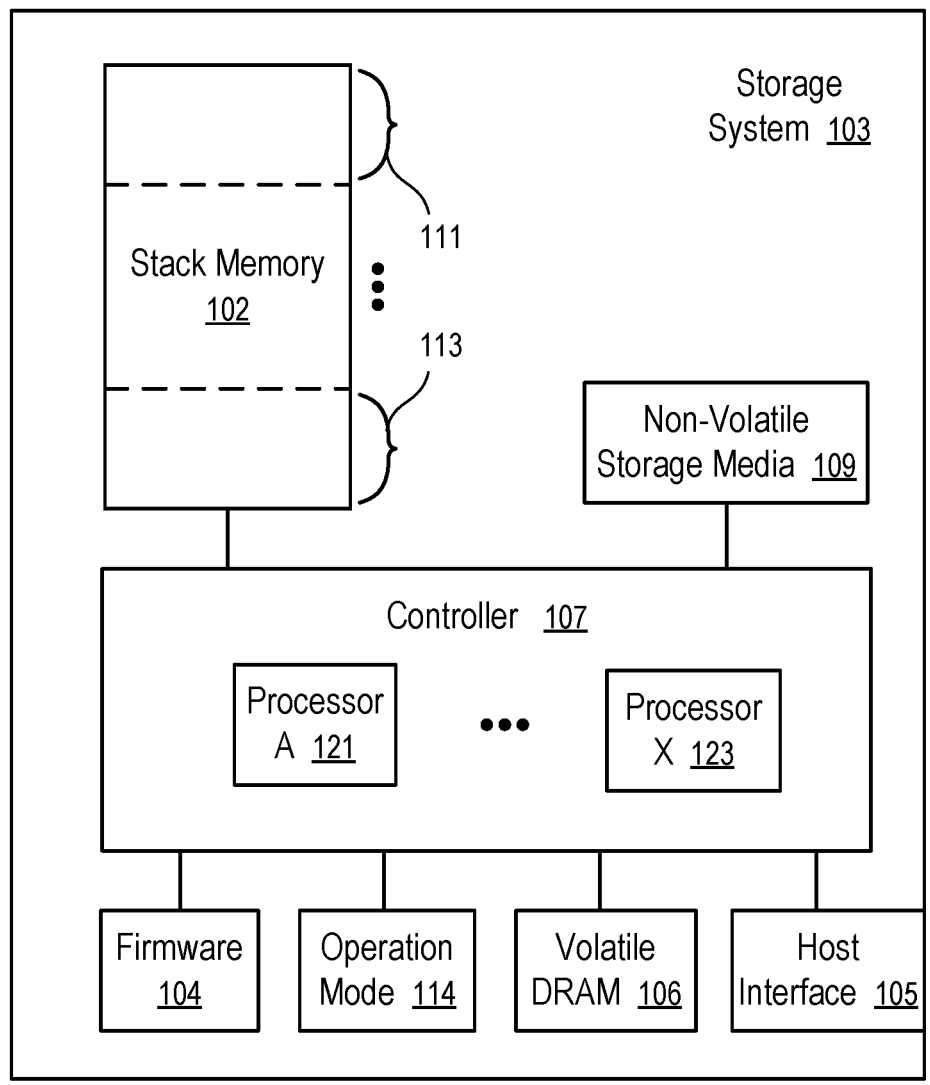
FIG. 2 shows a storage system configured to allocate stack memory based on operation modes.

FIG. 2 shows a storage system (103) configured to allocate stack memory based on operation modes. For example, the storage system (103) of FIG. 2 can be used as an example of the memory system (108) in the computing system of FIG. 1.

The storage system (103) has a stack memory (102) that can be partitioned into multiple stacks (111, . . . , 113) that are used respectively by multiple processors (121, . . . , 123)

(or processing cores, or processes running in the controller (107) of the storage system (103)).

The storage system (103) is configured via the firmware (104) to perform a set of normal functions when the storage system (103) is attached to a host system (101). Examples of the normal functions include receiving requests or commands from the host system (101) via a host interface (105), storing data in a non-volatile storage media (109) in response to write requests/commands from the host system (101), retrieving data from the non-volatile storage media (109) in response to read requests/commands from the host system (101), erasing data in the non-volatile storage media (109) in response to relevant requests/commands, etc.

Further, the storage system (103) configured via the firmware (104) has the capability to perform a set of factory functions that can be used during the manufacturing of the storage system (103). The factory functions can be performed to facilitate testing, diagnosis, etc. during the manufacturing phase of the storage system (103).

The storage system (103) stores the operation mode (114). When the operation mode (114) indicates that the storage system (103) is in the manufacturing phase, the firmware (104) configures the storage system (103) with capability of performing not only the normal functions but also the factory functions. When the operation mode (114) indicates that the storage system (103) is not in the manufacturing phase but in the production phase, the firmware (104) configures the storage system (103) with the capability of performing the normal functions but not the factory functions.

To have the capability of performing the factory functions, the controller (107) running the firmware (104) reserves and/or allocates a set hardware resources of the storage system (103). For example, a portion of the stack memory (102) is reserved for a processor (e.g., 121) and/or a process (e.g., running in a processor (e.g., 121)) that executes one or more factory functions programmed via the firmware (104). Some of the factory functions can be implemented via hardware logic circuitry and/or in combination with the firmware (104). Thus, when the storage system (103) runs in the factory mode during the manufacturing phase, the reserved portion of the stack memory (102) is not available for other processors (e.g., 123) and/or other processes that are programmed via the firmware (104) to execute the normal functions.

When the operation mode (114) indicates that the storage system (103) is not in the manufacturing phase but in the production phase, the factory functions are not necessary. Thus, the set of hardware resources of the storage system (103) that are reserved and/or allocated for the factory functions in the manufacturing phase can be released and made available for use in providing the normal functions. For example, when the storage system (103) runs in the user mode during the production phase, the portion of the stack memory (102) previously reserved for a processor (e.g., 121) and/or a process running in the processor (e.g., 121) to execute one or more factory functions can now be freed and used by processors (e.g., 121, . . . , 123) and processes that are programmed via the firmware (104) to provide the normal functions.

Figure 3:
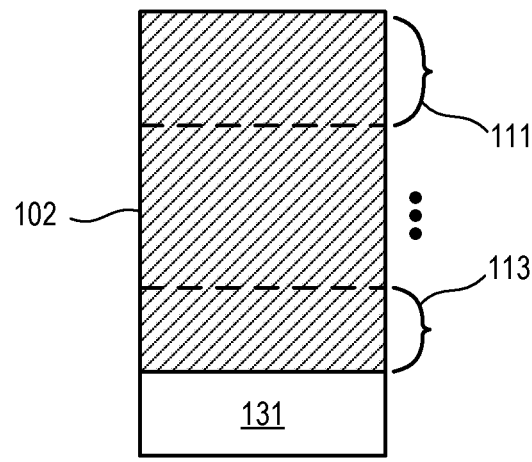
FIGS. 3 and 4 illustrate different allocations of stack memory in different operation modes.
Figure 4:
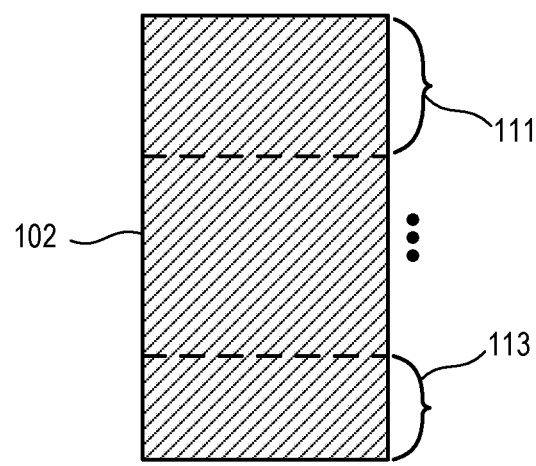

FIGS. 3 and 4 illustrate different allocations of stack memory in different operation modes. For example, the stack memory allocation technique illustrated in FIGS. 3 and 4 can be used in the memory system (108) of FIG. 1 in general and in the storage system (103) of FIG. 2 as an example.

FIG. 3 illustrates the allocation of the stack memory (102) when the operation mode (114) of the storage system (103) has a value corresponding to a factory mode. When in the factory mode, a portion (131) of the stack memory (102) is reserved for the factory functions (e.g., functions used in diagnosis operations, testing operations, etc. during the manufacturing phase of the storage system (103)). The remaining portion of the stack memory (102) is divided into multiple stacks (111, . . . , 113).

For example, the controller (107) of the storage system (103) has a plurality of processors (121, . . . , 123) that use the respective stacks (111, . . . , 113) to perform the normal functions of the storage system (103) (e.g., functions used in a user's computer system for data storage and retrieval). A process running in one of the processors (121, . . . , 123) uses a stack formed on the portion (131) of the stack memory (102) to perform the factory function(s) (e.g., for diagnosis or testing). The allocation of the portion (131) for the factory functions reduces the remaining portion of the stack memory (102) available for allocation to the stacks (111, . . . , 113) used by the normal functions (e.g., performing operations in response to read, write, and/or erasure requests/commands for a host system (101)).

In some instances, one of the processors (121, . . . , 123) is also reserved for the factory functions when the operation mode (114) identifies a factory mode. In other instances, one or more of the processors (121, . . . , 123) switch between processing the normal functions and the factory functions in the factory mode; and none of the processors (121, . . . , 123) is specifically reserved for the factory functions in the factory mode.

FIG. 4 illustrates the allocation of the stack memory (102) when the operation mode (114) of the storage system (103) has a value corresponding to a user mode. When in the user mode, the portion (131) of the stack memory (102) illustrated in FIG. 3 is no longer reserved for the factory functions (e.g., additional functions supportive diagnosis operations, testing operations, etc. using in a manufacturing phase of the storage system (103) in a manufacturing facility). Instead, the entire stack memory (102) is divided into multiple stacks (111, . . . , 113) that correspond to the stacks (111, . . . , 113) in FIG. 3. Since the portion (131) of the stack memory (102) reserved in the factory mode for factory functions is freed and made available to the stacks (111, . . . , 113) in FIG. 4, the sizes of the stacks (111, . . . , 113) in the user modes in FIG. 4 are larger than those of the corresponding stacks (111, . . . , 113) in the factory modes in FIG. 3. The increased stack sizes reduce the possibility of stack overflow. Stack overflow occurs when the memory requirement of a stack exceeds the size of the stack at a particular time instance of the use of the stack. When the portion (131) of the stack memory (102) is not reserved for factory functions (e.g., during the starting up process of the storage system (103)), the storage system (103) is not capable of performing the factory functions (e.g., without restarting the storage system (103). In some instances, the storage system (103) can be reconfigured to have the capability of performing the storage functions by changing the operation mode (114) to identify a factory mode and restarting the storage system (103) in the factory mode to reserve the portion (131) of the stack memory (102) during starting up the storage system (103).

In some instances, whether to make the reservation is based on the value of the operation mode (114) during the time of starting up (turning on, restarting, or powering up) the storage system (103). In other instances, the storage system (103) is capable of dynamically switching between the factory mode and the user mode based on the value of the operation mode (114) without a need to restart. In further instances, the operation mode (114) is determined based at least in part on a communication between the storage system (103) and the host system (101); and a predetermined identification and/or communication of the host system (101) in a manufacturing facility can cause the operation mode (114) to have a value identifying the factory mode; and the lack of the predetermined identification and/or communication can cause the operation mode (114) to have a value identifying the user mode.

In general, some of the stacks (111, . . . , 113) use more memory than others in some time periods. When a stack (111) is used to store a number of data items before the top data item is popped off the stack (111), the number of data items represent the depth of the stack (111) at the time before the top data item is popped off the stack (111). The depth of the stack (111) changes generally during a period of usage. The maximum depth of the stack (111) during a time period represents the memory requirement of the stack during the time period. Different stacks (111, . . . , 113) generally have different memory requirements.

Optionally, the storage system (103) is configured to monitor the memory requirements of the stacks (111, . . . , 113) in a time period and then adjust the partition of the stack memory (102) into the stacks (111, . . . , 113) according to their memory requirements such that a stack that is likely to require more memory is assigned a large portion of the stack memory (102). For example, the sizes of the stacks (111, . . . , 113) can be partitioned in proportional to the memory requirements in the past time period to reduce the likelihood of stack overflow.

For example, the stack memory (102) can be filled with data having a predetermined value (or data of a predetermined value pattern). Thus, the memory portions that store the predetermined value (or the predetermined value pattern) can be identified as portions of the stacks (111, . . . , 113) that have not been used during the past operations of the stacks (111, . . . , 113). During the operations of the stacks, data is pushed onto the stacks and popped off the stacks. At some time instances, the stack (e.g., 111) holds more data that is pushed into the stack than other time instances. When data is pushed onto the stack (e.g., 111), it changes the content of the used portion of the stack (e.g., 111) from the predetermined value (or the predetermined value pattern) to the data that is pushed onto the stack (e.g., 111). Some memory units in the stack may be overwritten multiple times during a time period of stack operations.

During a period of usage of a stack (e.g., 111), data may be pushed onto a stack (e.g., 111) from the top side of the stack (e.g., 111) to reach a depth. The used portions of the stacks (111, . . . , 113) have content different from the predetermined value (or the predetermined value pattern). The boundaries between the unused portions storing the content having the predetermined value (or the predetermined value pattern) (e.g., illustrated as the shaded areas) and the used portions not storing the content having the predetermined value (or the predetermined value pattern) identify the maximum depths reached at some time instances during the usages of the respective stacks (111, . . . , 113).

A boundary in a stack (111, . . . , 113) can be found efficiently using a binary search of the predetermined value (or the predetermined value pattern). For example, the stack manager (114) retrieves the data in the middle of a memory region that contains the boundary. Initially, the memory region may be the entire stack (111). If the data retrieved from the middle of a memory region has the predetermined value (or a value that agrees with the predetermined value pattern), the middle of the memory region is in the unused portion of the stack (e.g., 111); the boundary can be determined to be in the upper portion of the memory region where data popped onto the stack (e.g., 111) and stored in the upper portion of the memory region would be popped off the stack (e.g., 111) after the data in the middle of the memory region is popped off the stack (e.g., 111); and the subsequent search is performed in the upper portion of the memory region, which reduces the area of search from the entire memory region to the upper portion of the memory region. If the data retrieved from the middle of a memory region does not have the predetermined value (or a value that agrees with the predetermined value pattern), the middle of the memory region is in the used portion of the stack (e.g., 111); the boundary can be determined to be in the lower portion of the memory region where data popped onto the stack (e.g., 111) and stored in the lower portion of the memory region would be popped off the stack (e.g., 111) before the data in the middle of the memory region is popped off the stack (e.g., 111); and the subsequent search is performed in the lower portion of the memory region, which reduces the area of search from the entire memory region to the lower portion of the memory region. The operation of retrieving data from the middle of the memory region to be searched to identify the next memory region to be searched can be repeated until the boundary is found.

Further details and examples of performing a binary search to determine the maximum memory usages of the respective stacks (111, . . . , 113) to optimize or balance the sizes of the stacks (111, . . . , 113) can be found in U.S. patent application Ser. No. 15/922,702, filed Mar. 15, 2018 and entitled "Stack Management in Memory Systems," the entire disclosure of which is hereby incorporated herein by reference.

Figure 5:
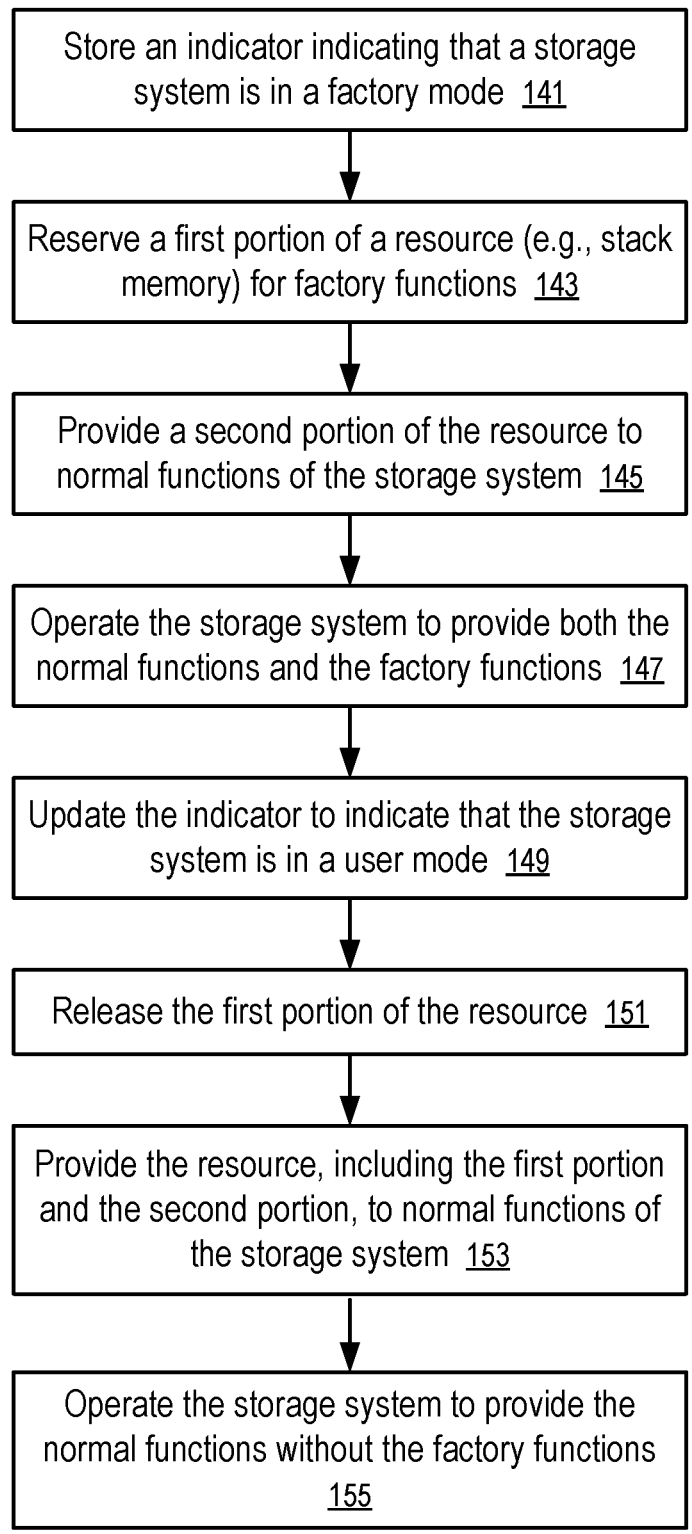
FIG. 5 shows a method to allocate resources according to operation modes.

FIG. 5 shows a method to allocate resources according to operation modes. For example, the method of FIG. 5 can be used in the memory system (108) of FIG. 1 in general and in the storage system (103) of FIG. 2 as an example, to implement the different allocations of stack memory illustrated in FIGS. 3 and 4 for different operation modes.

The method of FIG. 5 includes: storing (141) an indicator (114) indicating that a storage system (103) is in a factory mode; reserving (143) a first portion (131) of a resource (e.g., stack memory (102)) for factory functions; providing (145) a second portion of the resource (e.g., stack memory (102)) to normal functions of the storage system (103); operating (147) the storage system (103) to provide both the normal functions and the factory functions; updating (149) the indicator (114) to indicate that the storage system (103) is in a user mode; releasing (151) the first portion (131) of the resource (e.g., stack memory (102)); providing (153) the resource (e.g., stack memory (102)), including the first portion and the second portion, to normal functions of the storage system (103); and operating (155) the storage system (103) to provide the normal functions without the factory functions.

For example, a memory system (108) includes a mode indicator (114), a set of hardware resources (e.g., stack memory (102)), a set of media (109A, . . . , 109N, 109) and a controller (107).

When the mode indicator (114) identifies a factory mode (e.g., during booting up the memory system (109)), a first portion (131) of the hardware resources (e.g., stack memory (102)) is reserved for the performance of factory functions by the controller (107) executing the firmware (104) and a second portion of the hardware resources (e.g., stack memory (102)) is allocated for performance of normal functions. When the mode indicator (114) identifies a user mode (e.g., during booting up the memory system (109)), both the first portion and the second portion are allocated for the performance of the normal functions. For example, the normal functions are performed by the controller (107) to at least store data in and retrieve data from the set of media (109A, . . . , 109N, 109) of the memory system (108), in response to requests from a host system (101) that is currently connected to the memory system (108).

For example, the set of media (109A, . . . , 109N, 109) includes a flash memory; and the memory system (108) can be a storage system (103), such as a solid state drive (SSD).

During the manufacture phase of the memory system (108), the factory functions support diagnosis and testing. For example, the memory system (108) can be connected to a host system (101) in a manufacturing facility to perform diagnosis and testing of the memory system (108).

For example, during a manufacturing process of the memory system (108), the mode indicator (114) identifies the factory mode; and upon completion of the manufacturing process (e.g., the diagnosis and testing of the memory system (108)), the mode indicator (114) is changed to identify the user mode, such that when the memory system (108) is connected to a host system (101) of a user, after the completion of the production of the memory system (108), the memory system (108) has the normal functions but not the factory functions.

For example, the memory system is incapable of performing the factory functions when the first portion of the hardware resources is not reserved for the factory functions.

For example, in response to the mode indicator (114) identifying a user mode, the controller (107) running the firmware (104) removes a portion of the firmware (104) related to the factory functions. Thus, the memory system (108) is incapable of performing the factory functions after the mode indicator (114) is changed to identify the user mode. In other instances, the removal of the portion of the firmware (104) related to the factory functions is performed in the manufacturing facility in connection with the change of the mode indicator (114) from the factory mode to the user mode.

In some instances, the mode indicator (114) is changeable only once. To finalize the manufacture of the memory system (108), the mode indicator (114) is changed to a value for the user mode, which disables the factory functions.

The operations performed based on the mode indicator (114) of the storage system (103) can be implemented as a portion of the firmware (104) executing in the controller (107). Alternatively, the operations performed based on the mode indicator (114) of the storage device (103) can be implemented as a portion of the hardware circuitry of the controller (107). The controller (107) of the storage system (103) or the memory system (108) can have one or more processors (121, . . . , 123). One or more of the processors (121, . . . , 123) can be configured via the firmware (104) to implement at least some of the functions discussed above, such as the normal functions and/or the factory functions.

The storage system (103) of FIG. 2 can be attached to the host system (101) in FIG. 1 as an implementation of the memory system (108). A communication channel between the host system (101) and the memory system (108) in general and the storage system (103) in particular allows the host system (101) to send data requests and/or other commands that trigger certain operations of the controller (107) on the media (e.g., 109A to 109N, 109), such as data write operations, data read operations, data erasure operations. A host interface (105) implements the communication protocols of the communication channel.

In some implementations, the communication channel between the host system (101) and the memory system (108) or the storage system (103) includes a bus for computer peripheral devices, such as a PCIe bus, a SATA bus, a USB bus.

In some implementations, the communication channel between the host system (101) and the storage system (103) includes a computer network, such as a local area network, a wireless local area network, a wireless personal area network, a cellular communications network, a broadband high-speed always-connected wireless communication connection (e.g., a current or future generation of mobile network link); and the host system (101) and the storage system (103) can be configured to communicate with each other using data storage management and usage commands similar to those in NVMe protocol.

The controller (107) of the storage system (103) can run firmware (104) to perform operations responsive to the communications from the host system (101). Firmware in general is a type of computer program that provides control, monitoring and data manipulation of engineered computing devices.

The storage system (103) can have non-volatile storage media (109). Examples of non-volatile storage media (109) include memory cells formed in an integrated circuit and magnetic material coated on rigid disks. Non-volatile storage media (109) can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (107) has in-processor cache memory with data access performance that is better than the volatile DRAM (106) and/or the non-volatile storage media (109). Thus, it is preferred to cache parts of instructions and data used in the current computing task in the in-processor cache memory of the controller (107) during the computing operations of the controller (107). In some instances, the controller (107) has multiple processors (121, . . . , 123), each having its own in-processor cache memory.

Optionally, the controller (107) performs data intensive, in-memory processing using data and/or instructions organized in the storage system (103). For example, in response to a request from a host system (101), the controller (107) performs a real time analysis of a set of data stored in the storage system (103) and communicates a reduced data set to the host system (101) as a response. For example, in some applications, the storage system (103) is connected to real time sensors to store sensor inputs; and the processors (120, 121, . . . , 123) of the controller (107) are configured to perform machine learning and/or pattern recognition based on the sensor inputs to support an artificial intelligence (AI)

system that is implemented at least in part via the storage system (103) and/or the host system (101).

In some implementations, the processors (120, 121, . . . , 123) of the controller (107) are integrated with memory (e.g., 119, 109A, . . . , 109N, 106, 109) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate and decreases latency and power usage.

The storage system (103) can be used in various computing systems, such as a cloud computing system, an edge computing system, a fog computing system, and/or a standalone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

Some embodiments involving the operation of the controller (107) can be implemented using computer instructions executed by the controller (107), such as the firmware (104) of the controller (107). In some instances, hardware circuits can be used to implement at least some of the functions. The firmware (104) can be initially stored in the non-volatile storage media (109), or another non-volatile device, and loaded into the volatile DRAM (106) and/or the in-processor cache memory for execution by the controller (107).

A non-transitory computer storage medium can be used to store instructions of the firmware (104) of the memory system (108) in general and the storage system (103) in particular. When the instructions are executed by the controller (107) of the memory system (108) or the storage system (103), the instructions cause the controller (107) to perform a method discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or micro-controller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A memory system, comprising:
a mode indicator;
a set of hardware resources;
a set of media; and
a controller;
wherein when the mode indicator identifies a factory mode, a first portion of the hardware resources is reserved for performance of factory functions by the controller and a second portion of the hardware resources is allocated for performance of normal functions;
wherein when the mode indicator identifies a user mode, both the first portion and the second portion are allocated for the performance of the normal functions; and
wherein the normal functions are performed by the controller to at least store data into and retrieve data from the set of media in response to requests from a host system.

2. The memory system of claim 1, wherein the set of media includes a flash memory.

3. The memory system of claim 2, wherein the memory system is a solid state drive.

4. The memory system of claim 2, wherein the first portion of the hardware resources includes a portion of a stack memory.

5. The memory system of claim 4, wherein the factory functions support diagnosis and testing during manufacture of the memory system.

6. The memory system of claim 4, wherein the mode indicator identifies the factory mode during a manufacturing process of the memory system and identifies the user mode after the manufacturing process of the memory system.

7. The memory system of claim 4, wherein the memory system is incapable of performing the factory functions when the first portion of the hardware resources is not reserved for the factory functions.

8. The memory system of claim 7, wherein the memory system is incapable of performing the factory functions after the mode indicator is changed to identify the user mode.

9. The memory system of claim 8, wherein the mode indicator is changeable only once.

10. A method in a memory system, comprising:
providing the memory system having:
a mode indicator identifying a factory mode;
a set of hardware resources;
a set of media; and
a controller;
in response to the mode indicator identifying a factory mode during starting up the memory system,
reserving a first portion of the hardware resources for performance of factory functions by the controller; and
allocating a second portion of the hardware resources for performance of normal functions, wherein the normal functions are performed by the controller to at least store data into and retrieve data from the set of media in response to requests from a host system; and
changing the mode indicator from identifying a factory mode to identifying a user mode upon completing a manufacturing process of the memory system, wherein when the mode indicator identifies the user mode, both the first portion and the second portion are allocated for the performance of the normal functions.

11. The method of claim 10, wherein the set of media includes a flash memory;
and the memory system is a solid state drive.

12. The method of claim 11, wherein the first portion of the hardware resources includes a portion of a stack memory.

13. The method of claim 12, further comprising:
freeing the first portion of the hardware resources from reservation for performance of the factory functions in response to the mode indicator identifying the user mode during starting up the memory system.

14. The method of claim 10, further comprising:
performing diagnosis and testing using the factory functions of the memory system during manufacture of the memory system.

15. The method of claim 14, wherein the memory system is incapable of performing the factory functions when the first portion of the hardware resources is not reserved for the factory functions.

16. The method of claim 15, wherein the memory system is incapable of performing the factory functions after the mode indicator is changed to identify the user mode.

17. A non-transitory computer storage medium storing instructions which when executed by a controller of a memory system cause the memory system to perform a method, the method comprising:
in response to a mode indicator of the memory system identifying a factory mode during starting up the memory system,
reserving a first portion of hardware resources for performance of factory functions by a controller of the memory system; and
allocating a second portion of the hardware resources for performance of normal functions; and
in response to the mode indicator identifying a user mode during starting up the memory system,
releasing the first portion of the hardware resources from reservation for the performance of the factory functions; and
allocating both the first portion and the second portion for the performance of the normal functions, wherein the normal functions are performed by the controller to at least store data into and retrieve data from a set of media of the memory system in response to requests from a host system.

18. The medium of claim 17, wherein the set of media includes a flash memory;
the memory system is a solid state drive; and the method further comprises:
performing diagnosis and testing using the factory functions of the memory system during manufacture of the memory system.

19. The medium of claim 18, wherein the factory functions are disabled when the first portion of the hardware resources is not reserved for the factory functions.

20. The medium of claim 18, wherein the memory system is incapable of performing the factory functions after the mode indicator is changed to identify the user mode.

* * * * *